(12) United States Patent
Takada et al.

(10) Patent No.: US 6,883,384 B2
(45) Date of Patent: *Apr. 26, 2005

(54) FORCE SENSING DEVICE HAVING MAGNETIZED ELEMENT AND MAGNETO ELECTRIC MATERIAL

(75) Inventors: Akio Takada, Singapore (SG); Minoru Ikarashi, Yokohama (JP)

(73) Assignee: Sony Corporation, Tokyo (JP)

( * ) Notice: Subject to any disclaimer, the term of this patent is extended or adjusted under 35 U.S.C. 154(b) by 9 days.

This patent is subject to a terminal disclaimer.

(21) Appl. No.: 10/366,209

(22) Filed: Feb. 13, 2003

(65) Prior Publication Data

US 2003/0200820 A1 Oct. 30, 2003

(30) Foreign Application Priority Data

Feb. 15, 2002 (SG) .......................................... 200200806

(51) Int. Cl.[7] ............................................... G01L 1/00
(52) U.S. Cl. ........................................................ 73/779
(58) Field of Search .................... 73/777, 779, 862.381, 73/763, 862.69

(56) References Cited

U.S. PATENT DOCUMENTS

| 5,198,740 A | * | 3/1993 | Jacobsen et al. | ............ 318/687 |
| 5,702,592 A | * | 12/1997 | Suri et al. | ...................... 210/90 |
| 6,111,390 A | * | 8/2000 | Inaba et al. | .................... 322/28 |

* cited by examiner

Primary Examiner—Max Noori
(74) Attorney, Agent, or Firm—Frommer Lawrence & Haug LLP; William S. Frommer

(57) ABSTRACT

The present invention relates to a force sensing device, and in particular to a force sensing device for sensing an oscillating force or for application as a filter. In general terms, the invention proposes a force sensing device having a magneto electric material and a magnetic element moveable relative thereto in response to an applied force. The magneto electric material is exposed to the magnetic field of the magnetic element which has a magnetisation direction parallel to the direction of the movement.

10 Claims, 16 Drawing Sheets

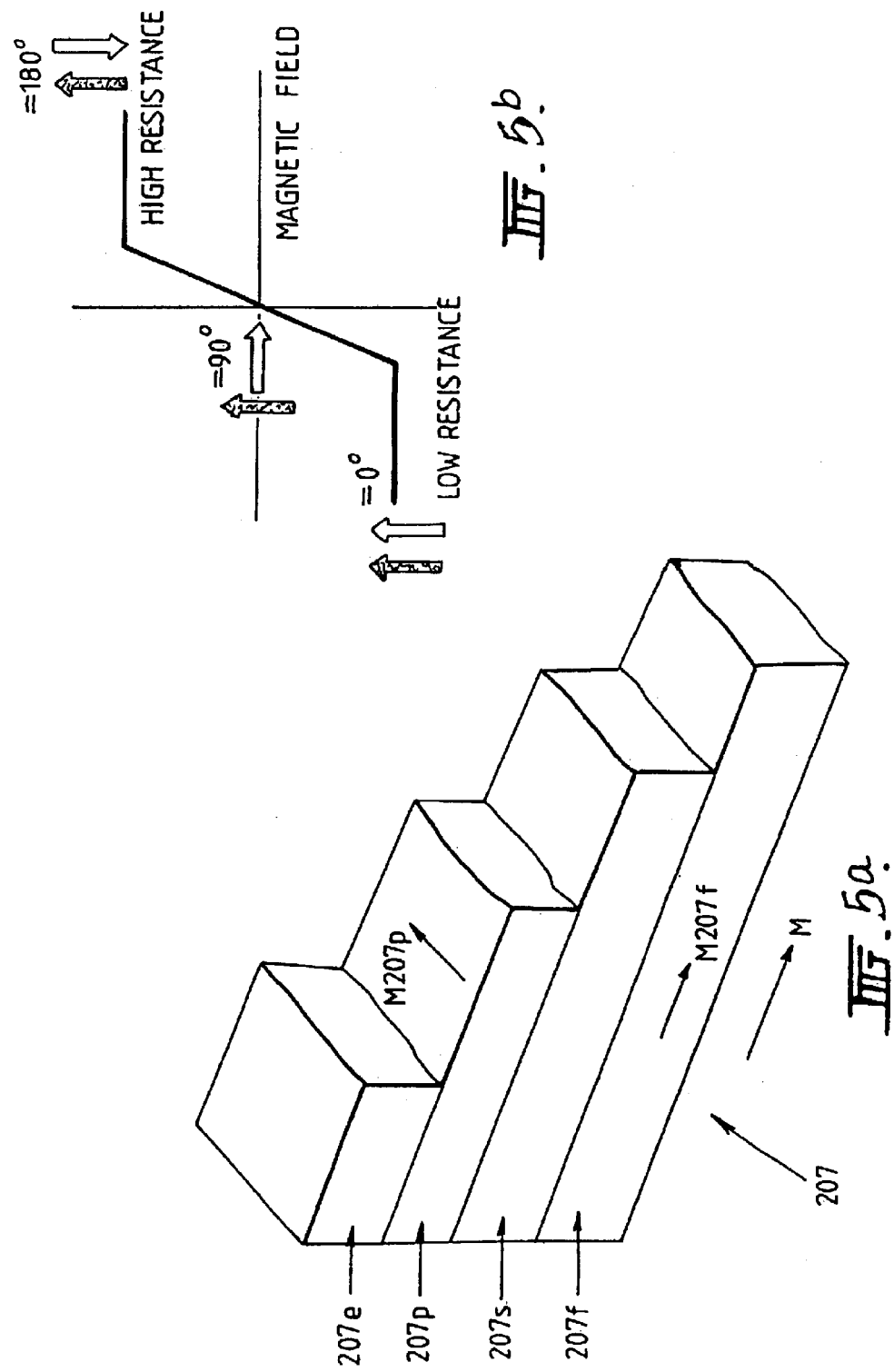

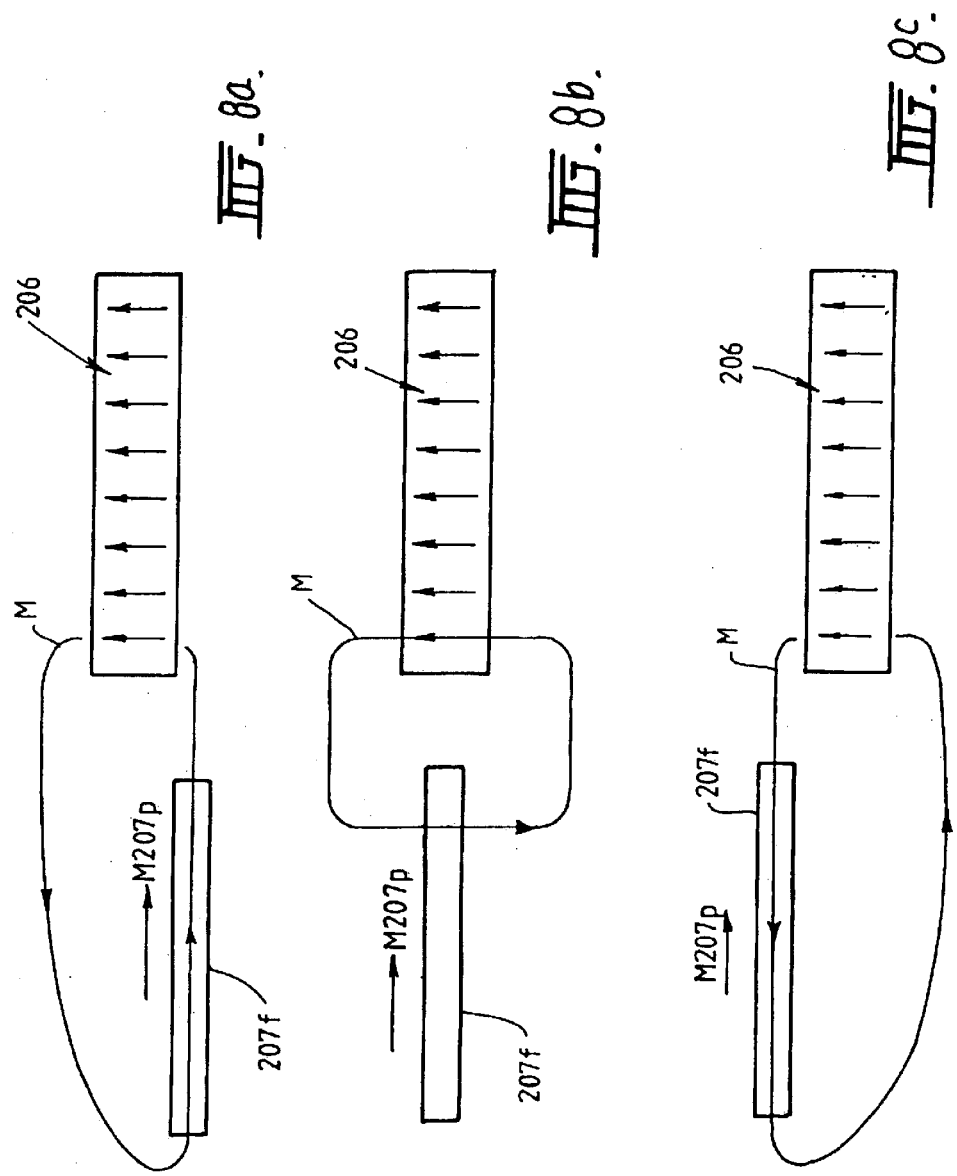

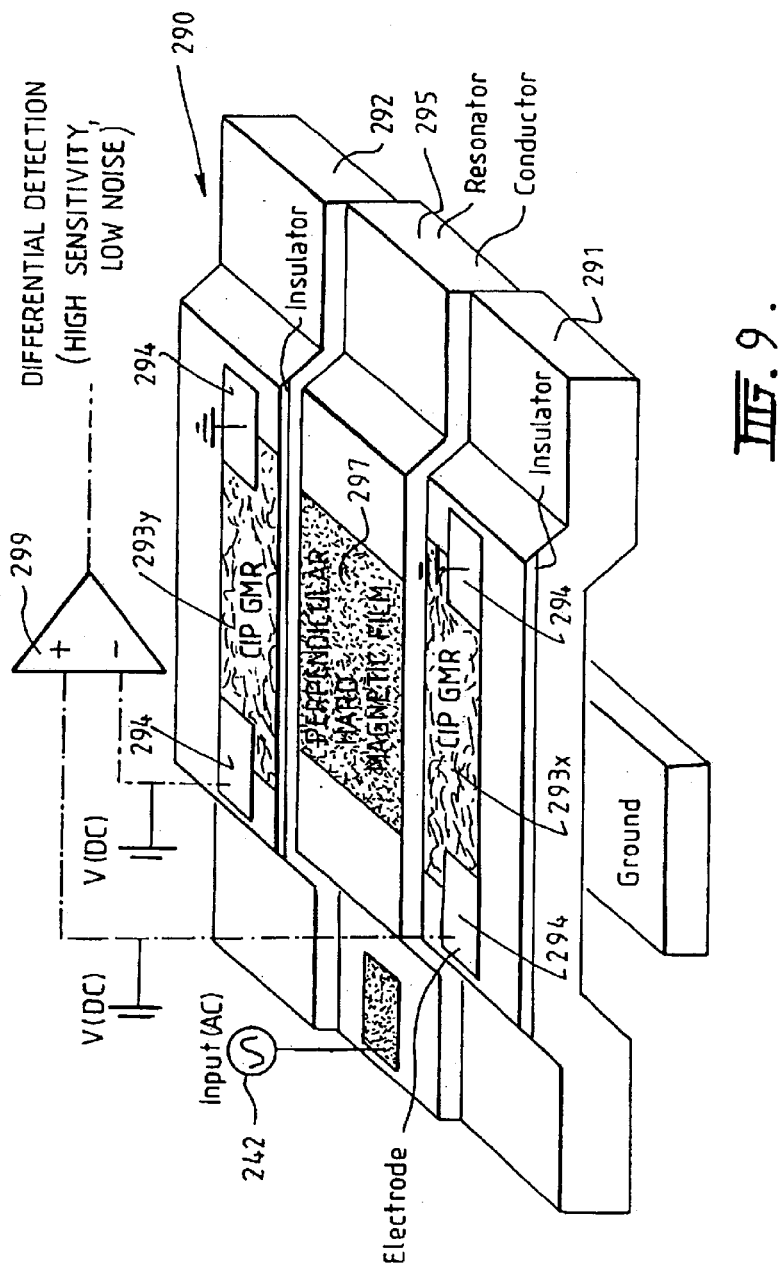

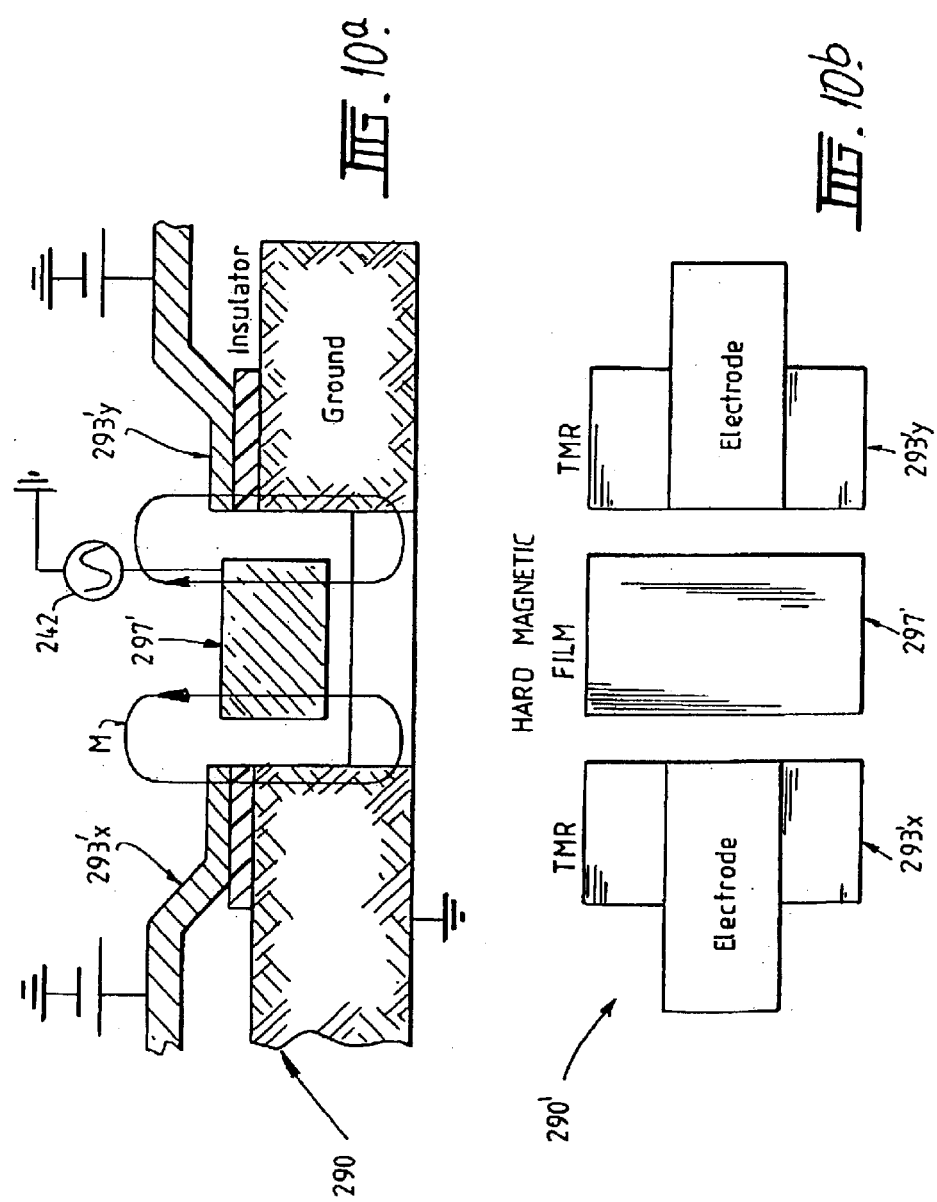

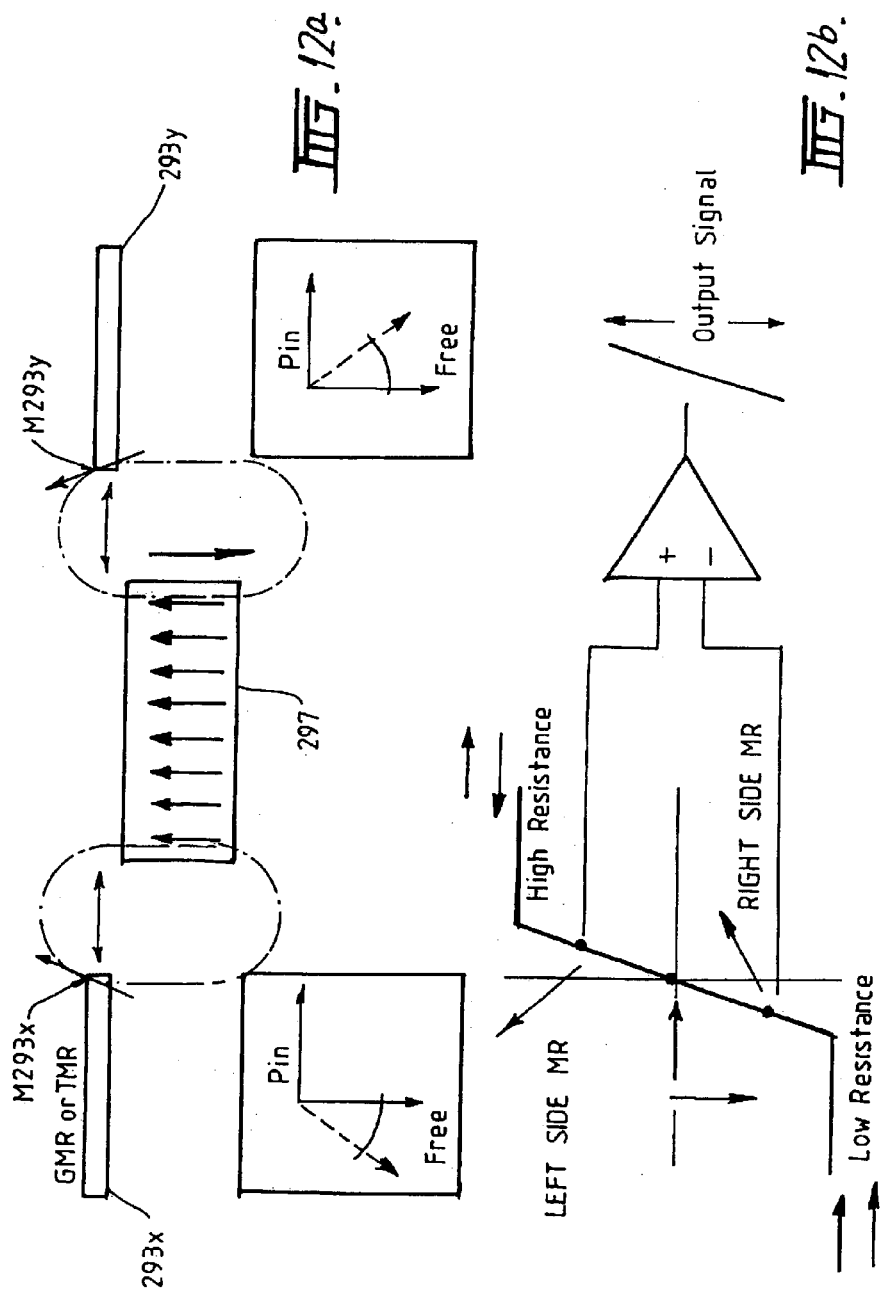

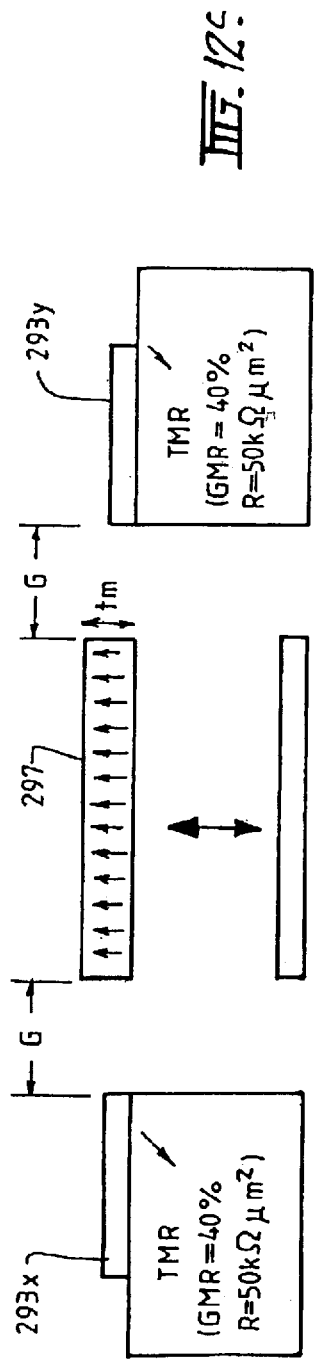
FIG. 12c.
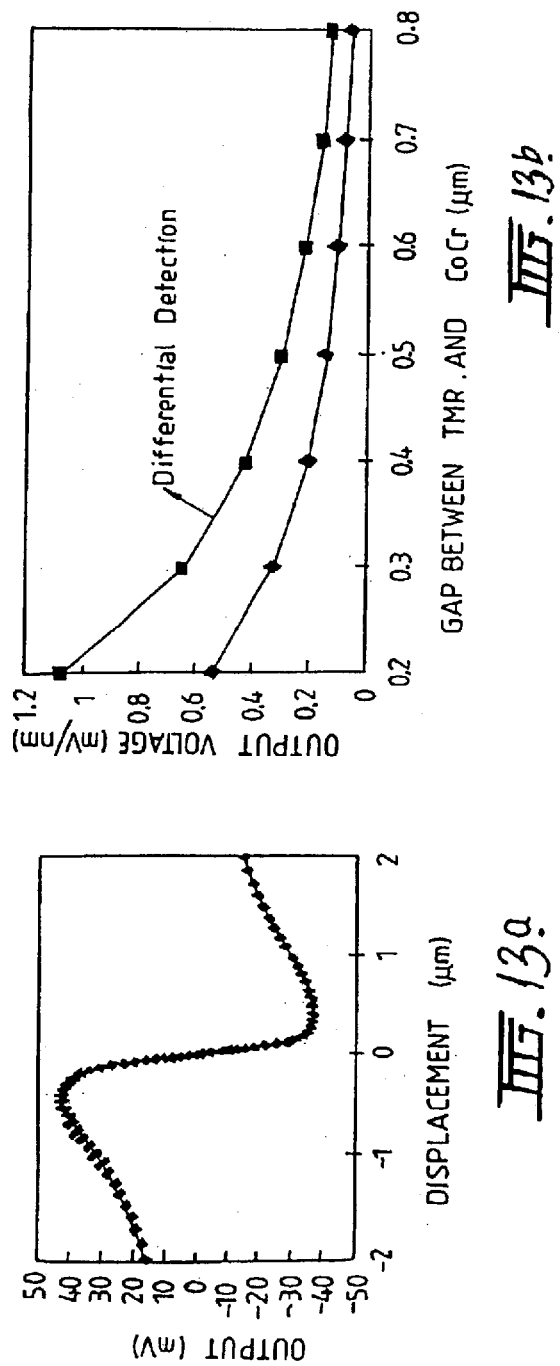
FIG. 13b.
FIG. 13a.

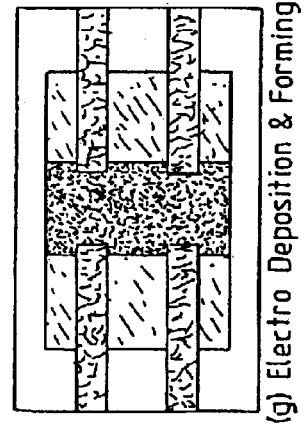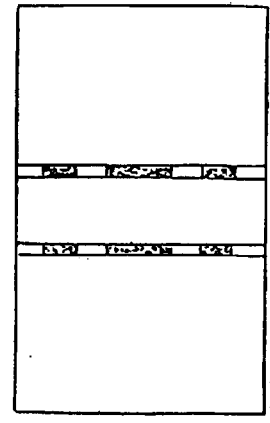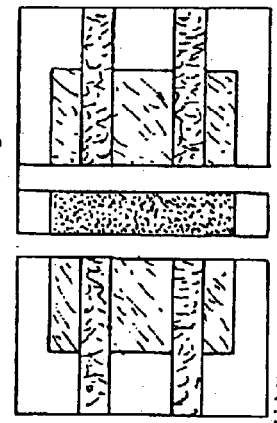
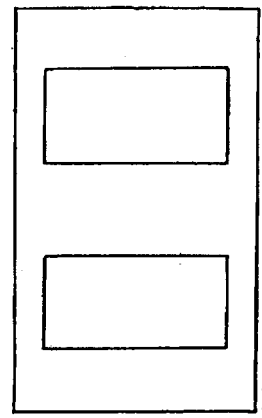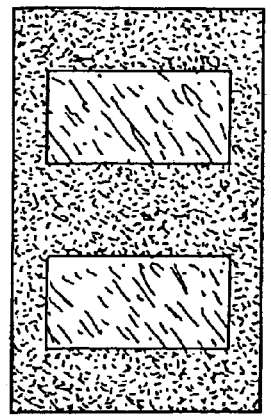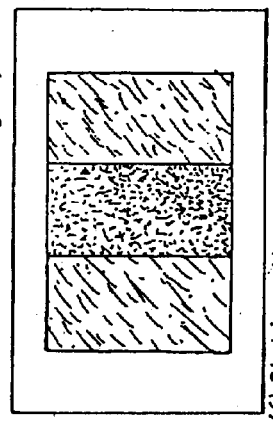
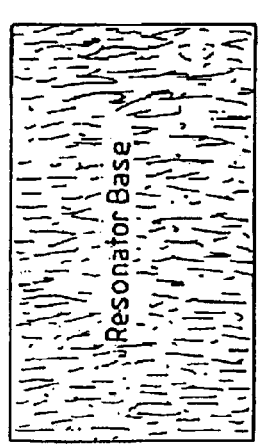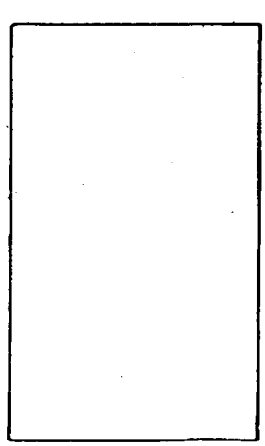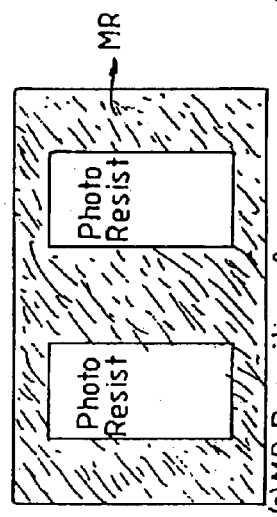
FIG. 14.

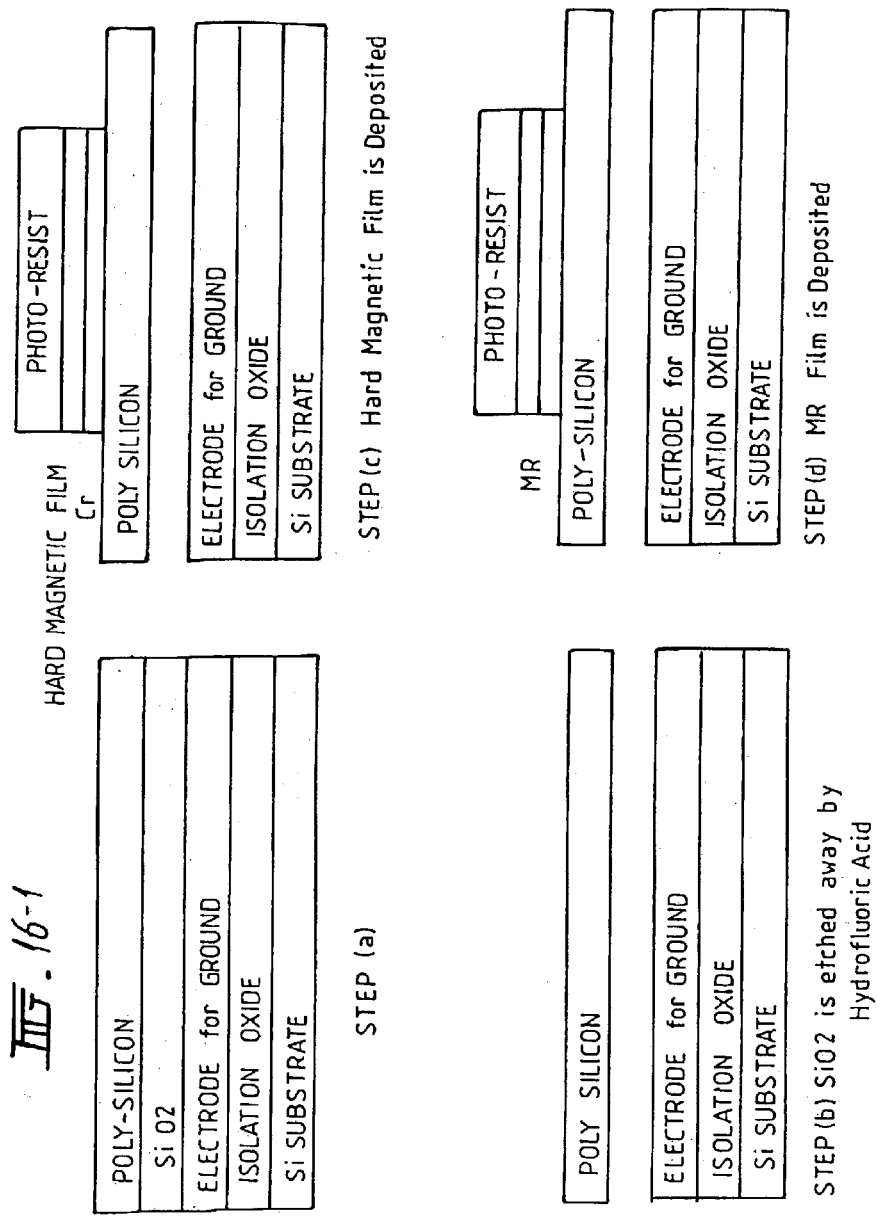

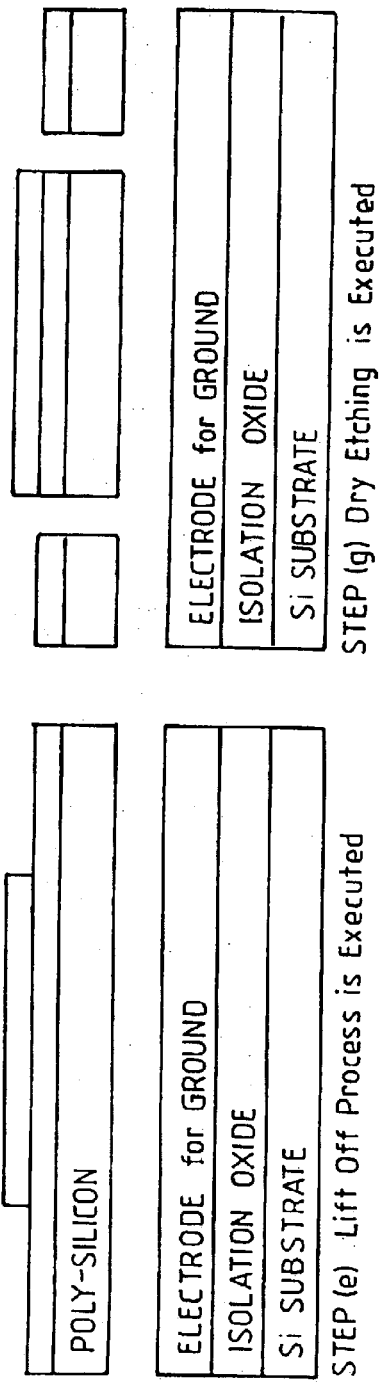

US 6,883,384 B2

FORCE SENSING DEVICE HAVING MAGNETIZED ELEMENT AND MAGNETO ELECTRIC MATERIAL

FIELD OF THE INVENTION

The present invention relates to a force sensing device, and in particular, though not exclusively to a force sensing device for sensing an oscillating force or for application as a filter.

BACKGROUND OF THE INVENTION

Known force sensing apparatus typically use capacitive based micro-electro mechanical systems (MEMS) arrangements to convert detected mechanical (for example acoustic) vibrations into electrical signals. These arrangements detect the change in capacitance between two plates caused by the mechanical vibrations. However such capacitance devices rely on electrostatic detection which requires a high DC bias voltage. Also as the sensitivity of the sensor depends only on the changes in the capacitance, it is difficult to design and manufacture high sensitivity devices.

SUMMARY OF THE INVENTION

It is an object of the present invention to provide an improved or at least alternative force sensing device for sensing an oscillating force or as a filter.

In general terms, the invention proposes a force sensing device having a magneto electric material and a magnetic element moveable relative thereto in response to an applied force. The magneto electric material is exposed to the magnetic field of the magnetic element which has a magnetisation direction parallel to the direction of the movement.

Specifically, in a first aspect the invention proposes a force sensing device having a magnetised element and a magneto electric material being each relatively moveable with respect to the other in response to an applied force, the magnetised element having a magnetisation direction parallel to the direction of said relative movement;

the device being arranged such that said material is subject to the magnetic field of said element and such that an electrical property of said material which is indicative of said applied force varies dependent said relative movement.

In the context of this application, the term "magneto-electrical material" includes any material in which an electrical property of the material changes in response to changes in a magnetic field to which the material is exposed.

Preferably, the magneto-electrical material may comprise a magneto resistive material, for example an anisotropic magneto resistive material, a giant magneto resistive (GMR) material or a tunnel magneto resistive (TMR) material. Alternatively, the magneto-electrical material may comprise a Hall effect material, an inductive sensor or a magneto impedance sensor.

Preferably, the force sensing device may be a micro-electro mechanical system and may be formed on a single chip or die formed from a suitable substrate, such as a silicon wafer. In this case, preferably, the magnetised member comprises a permanent magnetic film formed on a portion of the substrate and the magneto-electrical material is also in the form of a thin film formed on the substrate, such as a magneto resistive alloy film. Typically, the permanent magnetic film may be a cobalt alloy or an iron alloy. Examples of suitable alloys include CoCr, CoPt, CoCrPt, CoCrTa and $\gamma$-$Fe_2O_3$.

Typically, the force sensing device is for sensing an oscillating force such as a microphone or filter. However, it may also be used to sense non-oscillating forces, such as acceleration or changes in air pressure.

In a second aspect the invention proposes a force sensing device comprises a magnetised member mounted on a substrate, a magneto-electrical material mounted on the substrate such that the magneto-electrical material is subjected to the magnetic field generated by the magnetised member, a movable member mounted for movement in response to an applied force, movement of the movable member causing a change in the magnetic field experienced by the magneto-electrical material, and an electrical property of the magneto-electrical material changing in response to changes in the magnetic field experienced by the magneto-electrical material due to movement of the movable member;

wherein the magnetised member comprises a hard magnetic thin film that is magnetised perpendicularly to the surface of the film such that the direction of the magnetisation is parallel to the direction of movement.

Preferably the magnetic easy axis of the magneto-electrical material is perpendicular to the direction of the magnetic field generated by the magnetised member.

BRIEF DESCRIPTION OF THE DRAWINGS

The present invention is described with reference to the following drawings, by way of example only and without intending to be limiting, in which:

FIG. 5a shows a sensor structure, and FIG. 5b shows a response curve of this sensor;

FIGS. 8a, 8b, and 8c show the effect of movement of the magnetic film on the magnetic field felt by the sensor;

FIG. 9 is a perspective view of a magnetic MEMS filter incorporating differential detection;

FIG. 10 is a section view of the filter similar to that of FIG. 9 but incorporating a CPP GMR sensor;

FIGS. 11 and 12 show how the differential detection method operates;

FIG. 13 shows simulation results comparing sensor output with and without differential detection;

FIGS. 14, 15, 16-1 and 16-2 show a fabrication method for producing the high frequency filter of FIG. 9 using different sensor types.

DETAILED DESCRIPTION

Figure 1:
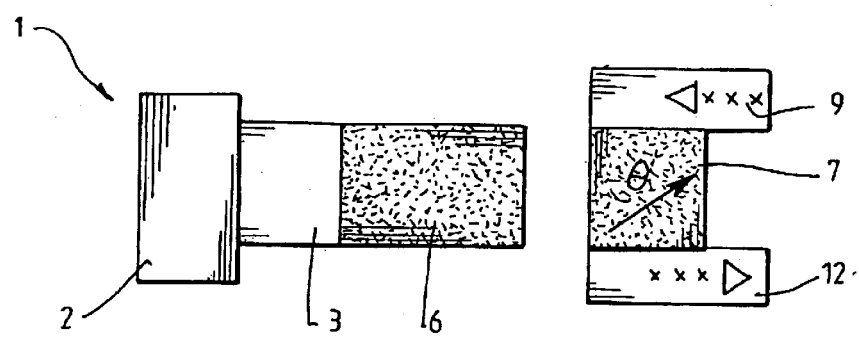
FIG. 1 is a plan view of a force sensing device including a cantilever.
Figure 2:
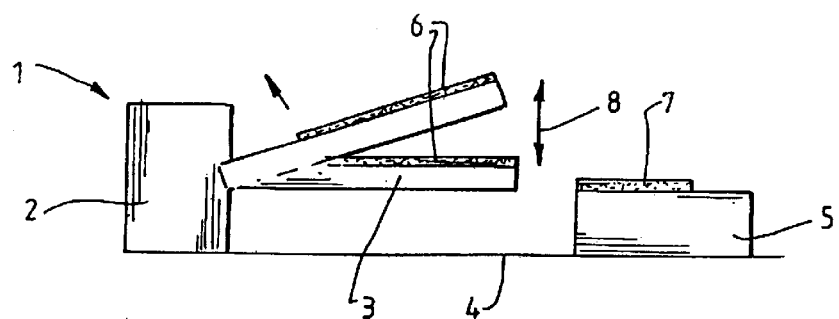
FIG. 2 is a side view of the device shown in FIG. 1.

FIGS. 1 and 2 show a force sensing device in which changing magnetic fields corresponding to mechanical vibration are detected. It has been found that this method of detecting mechanical vibration is more sensitive than prior art methods utilising capacitive MEMS devices.

The device 1 includes a support portion 2 that supports a cantilevered member 3. The support portion 2 is mounted on a base 4 that also has a sensor support 5 mounted on the base. The cantilevered member 3 has a hard (or permanent) magnetic film 6 formed on its surface. The sensor support 5 has a thin film of a magneto resistive material (MR) 7 and two contact electrodes 12 formed on the top surface of the sensor support 5 and connected to the MR thin film 7 which is adjacent to but separated from the magnetic thin film 6. Other magneto electrical material could alternatively be used for example a Hall element or an MI (Magneto Inductance) element.

When the cantilevered member 3 moves in either of the directions indicated by arrow 8, the magnetic field experienced by the MR thin film 7 changes which produces a change in the resistivity of the MR thin film 7. This change in resistivity can be detected by a change in a bias current 9 injected through the film 7 via electrodes 12. The change in resistivity (and therefore in measured voltage across the MR thin film 7) corresponds to the movement of the cantilevered member 3 and so the device 1 generates an electrical output in response to the mechanical movement of the member 3.

To improve the sensitivity of the device 1, a hard magnetic film 206 is applied to the cantilever member 3 in which the direction of magnetisation is perpendicular to the length of the thin film 206 and hence parallel to the direction of vibration (8). A comparison of the sensitivity of a device 1 using longitudinal hard magnetic film 6 and a device 201 using perpendicular hard magnetic film 206 are shown in FIGS. 3 and 4 respectively.

Figure 3A:
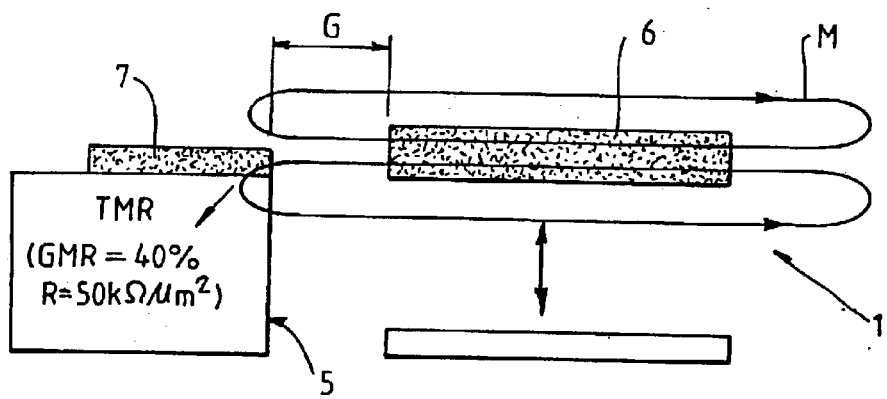
FIGS. 3a and 3b show respectively a force sensing device having longitudinal hard magnetic film and a graph of its output voltage as a function of the movement of the film past a magneto-electrical material sensor.

In device 1 of FIG. 3a, the hard magnetic film 6 has a longitudinal magnetisation, that is the magnetic fields M are aligned along the length of the hard magnetic film 6 as shown. The direction of vibration is transverse or perpendicular to the length of the film 6 and hence the direction of the magnetic field M. As the film 6 is moved transversely with respect to the sensor 7, the resistivity of the sensor 7 changes proportional to this movement. The change in the sensor resistance and hence the movement of the hard film 6 can be detected by injecting a bias current 9 through the sensor 7 and determining the voltage across the sensor 7.

Figure 3B:
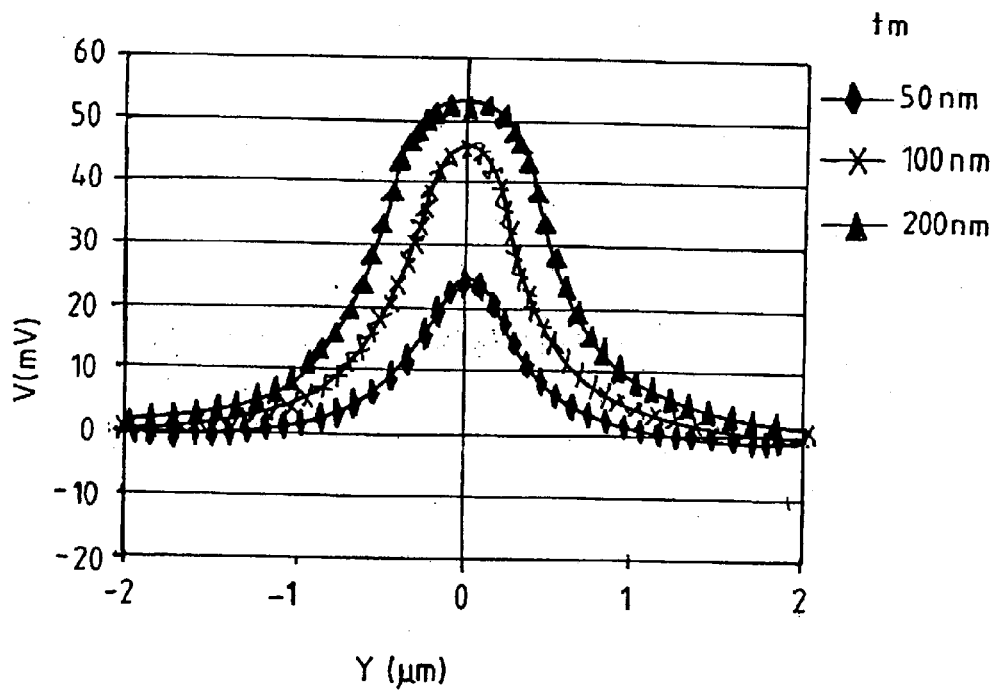

The change in measured voltage across the sensor 7 is dependent on the distance moved by the hard magnetic film 6 from its centre position (y=0), and is shown in the graph of FIG. 3b. Looking at the result for a magnetic thin film thickness (tm) of 200 nm, it can be seen that the output voltage varies from approximately 50 mV at zero displacement (y=0), to a minimum of 0V for a 2 um displacement (y=2 um or y=2 um) of the hard magnetic film 6 from either side of the zero displacement line (y=0). The maximum change in output voltage therefore is 50 mV for this device 1.

Figure 4A:
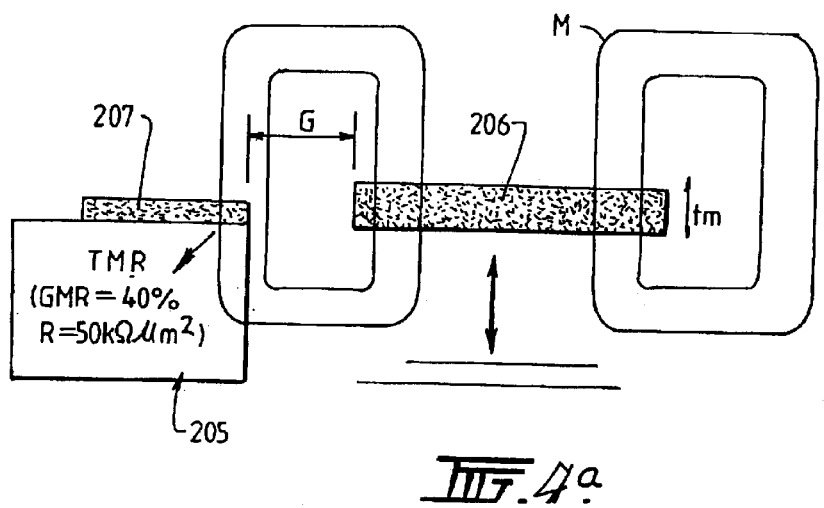
FIGS. 4a and 4b show respectively a force sensing device having perpendicular hard magnetic film and a graph of its output voltage as a function of the movement of the film past a magneto-electrical material sensor.

FIG. 4a shows a device 201 similar to that of FIG. 3 except that the hard magnetic film 206 has a perpendicular magnetisation, that is the magnetic fields M are aligned perpendicular to the length of the hard magnetic film 206. The direction of vibration is transverse or perpendicular to the length of the film 206 and hence parallel to the direction of magnetisation of the magnetic film 206. As the film 206 is moved transversely with respect to the sensor 207, the resistivity of the sensor 207 changes proportionally with this movement. The change in the sensor resistance and hence the movement of the hard film 206 is detected in the same way as the device 1 of FIG. 3a; by injecting a current through the sensor 207 and determining the voltage across the sensor 207.

Figure 4B:
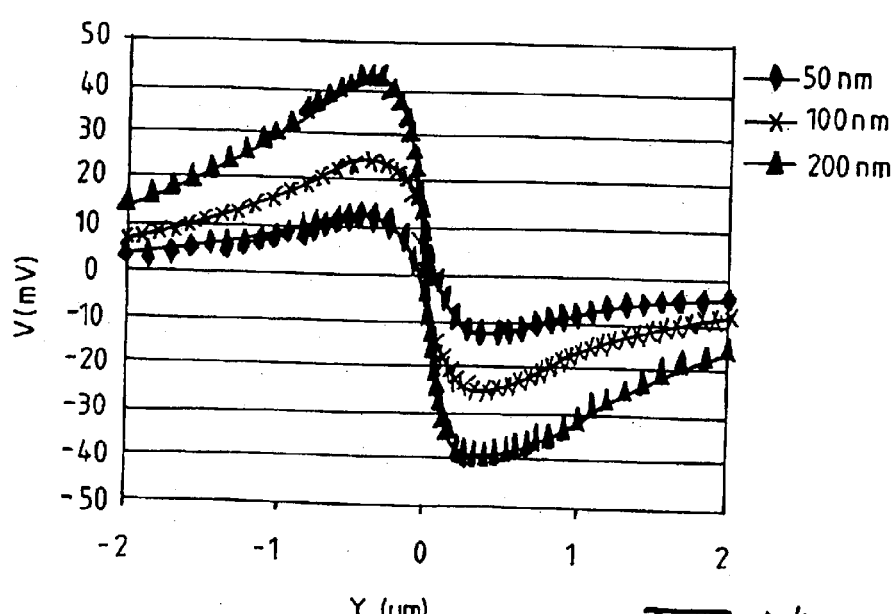

The change in measured voltage across the sensor 207 is dependent on the distance moved by the hard film 206 from its centre position (y=0), and is shown in the graph of FIG. 4b. Looking at the result for a magnetic thin film thickness (tm) of 200 nm, it can be seen that the output voltage varies from approximately 0V at zero displacement (y=0), to a maximum of +41 mV for a 0.5 um displacement (y=0.5 um) of the hard magnetic film 206 on one side of the zero displacement line (y=0), and a maximum of −41 mV for a 0.5 um displacement (y=−0.5 um) of the hard magnetic film 206 on the other side of the zero displacement line (y=0). The maximum change in output voltage therefore is 80 mV for this device 201. The unexpectedly large increased output voltage range contributes to the increased sensitivity of this device 201 compared with the device 1 of FIG. 3a.

It should be noted that the maximum voltage outputs of the device 201 of FIG. 4 are for displacements of 0.5 um compared with the 2 um displacements required for the device 1 of FIG. 3. By direct comparison, the output voltage change of the device 1 of FIG. 3 at 0.5 um is only 21 mV, or only a quarter that of the device 201 of FIG. 4.

It should also be noted that the direction of displacement of the film 206 is more readily discernible with the device 201 of FIG. 4a as this determines the sense or polarity of the voltage detected. For example as shown in FIG. 4b a positive y displacement gives a negative output voltage whereas a negative y displacement gives a positive voltage output.

In the device 1 of FIG. 3a, the output voltage is always positive, irrespective of the direction of displacement. In order to determine the direction of displacement, the film 6 is located with an initial offset so that at rest it is already displaced "below" the sensor 7. Looking at FIG. 3b, the device might have a rest location at y=−1 um, and in use operates about this part of the graph. However this has the disadvantage of reducing the sensitivity of the device. By contrast, the perpendicular magnetic film 206 of the device 201 of FIG. 4a can be located at rest adjacent the sensor 207 to take maximum advantage of its high sensitivity close to the 0 um displacement region. In use, the vibration amplitude is typically only a few nm, and as can be seen from FIG. 4b this corresponds to the steepest part of the graph, and hence the most sensitive range of the device 201.

By using perpendicular magnetic permeability to produce magnetic field lines M which are substantially parallel to the direction of vibration, the sensitivity of the device 201 can be increased significantly. This can be used to increase the device's sensitivity to vibrational movement, or it can allow larger gaps G between the magnetic film 206 and the magneto electric material sensor 207 which are easier to fabricate making the device 201 cheaper to produce.

Magnetic materials with perpendicular magnetic permeability 206 suitable for use in this embodiment include: Co/Pd multiplayer as described in Journal of Magnetic Society of Japan, Vol. 25, No. 4-2, pp535–538, 2001; and CoCrTa as described in Journal of Magnetic Society of Japan, Vol. 25, No. 4-2, pp539–542, 2001.

Co, Fe and Ni are typical ferromagnetic materials. To obtain longitudinal or perpendicular magnetic characteristics, a combination of these ferromagnetic materials and other materials, together appropriate seed layer and deposition. For example, Cr/CoCrPt (where Cr is underneath) gives a longitudinal film, and Ti/CoCrNb gives a perpendicular film. Theoretically these are subject to the following relationship:

$Ku > 2\ piMs^2$ perpendicular magnetic film $Ku < 2\ piMs^2$ longitudinal magnetic film Where Ku is the uniaxial anisotrophy constant, and Ms is saturation magnetisation.

FIG. 5a shows a magneto resistance MR sensor 207 comprising magneto electrical material (in this case GMR), and which has an exchange layer 207e, a pinned layer 207p, a spaced layer 207s, and a free layer 207f. The exchange layer 207e is for making an exchange coupling with the pinned layer. When an antiferromagnetic film (eg PtMn) is properly deposited next to ferromagnetic film (e gCo), so called exchange coupling occurs. As a consequence the magnetisation direction of the ferromagnetic film is aligned and fixed unless a large external magnetic filed is applied. The coupled ferromagnetic film is known as the pinned layer in GMR/TMR stacks, and comprises a material having an antiferromagnetic property, for example PtMn. In antiferromagnetic materials the magnetic moments of adjacent atoms point in different directions and thus there is no net macroscopic magnetic moment in the material. The pinned layer 207p is adjacent the exchange layer 207e and has a predetermined and fixed magnetisation direction shown as $M_{207p}$, which is set at the time of fabrication. The pinned layer is made of magnetic material, for example Co. The spaced layer 207s is adjacent the pinned layer 207p such that the pinned layer 207p is sandwiched between the exchange layer 207e and the spaced layer 207s. The spaced layer 207s provides a short circuit between the pinned layer 207p and the free layer 207f for electrons flowing between the electrodes 212 of the sensor 207. The spaced layer is made of a non-magnetic conductive material, for example Cu, $Al_2O_3$. A spaced layer is employed as otherwise the magnetic moments of the free layer could not rotate freely due to the strong magnetic coupling of the pinned layer. The cause of resistance between electrodes for spin value or TMR is simply that the resistance is proportional to the scattering of electrons which pass through a spacer between the pinned and free layers. The free layer 207f is adjacent the spaced layer 207s such that this is sandwiched between the free layer 207f and the pinned layer 207p. The free layer 207f has a magnetisation direction (shown as M 207f) that is dependent on an external applied magnetic field M. The free layer 207f is made of a magnetic material, for example Co.

The resistance of the magneto resistive sensor 207 is dependent on the magnetisation angle between the magnetisation direction of the pinned layer 207p and the magnetisation direction of the free layer 207f. The resistance is a minimum where the magnetisation directions of the pinned 207p and free 207f layers are parallel (magnetisation angle= 0), and a maximum when the magnetisation directions are opposite (magnetisation angle=180 degrees). This is shown in FIG. 5b in a graph of applied magnetic field direction versus sensor 207 resistance.

Figure 6A:
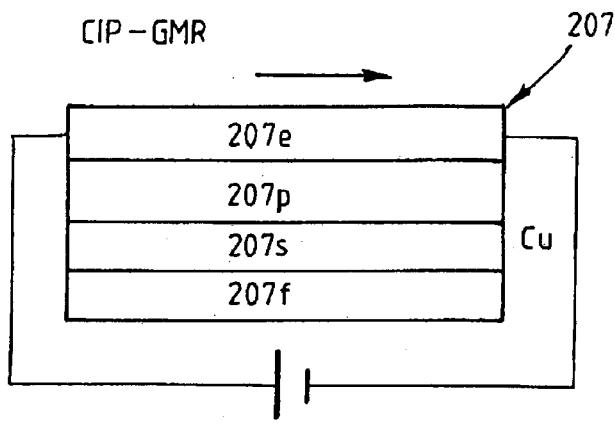
FIGS. 6a, 6b, and 6c show three types of magneto-electrical sensor.
Figure 6B:
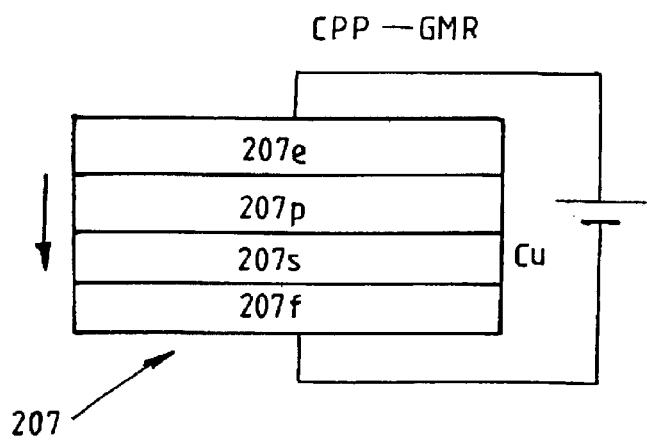
Figure 6C:
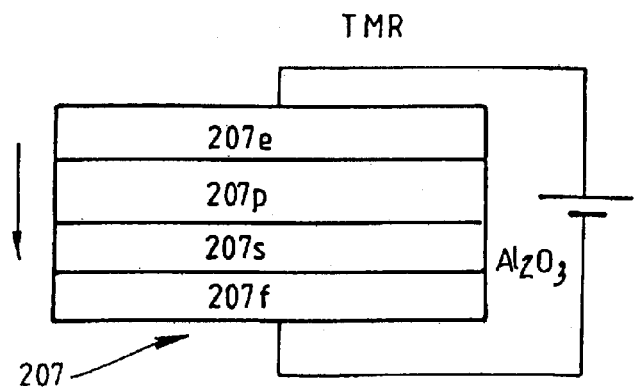

FIG. 6a-c show three different types of magneto resistive sensors 207. FIG. 6a shows a CIP (current in the plane) GMR (Giant magneto resistive) sensor, in which bias current runs through and across all the four layers 207e, 207p, 207s, 207f. FIG. 6b shows a CPP (current perpendicular to the plane) GMR sensor, in which bias current runs through in a perpendicular direction all four layers of the sensor. FIG. 6c shows a TMR sensor, in which bias current runs through all four layers.

The principle of operation of CPP GMR is the same as CIP. The difference is the current direction for biasing. The operation principle of TMR is different from GPP GMR. TMR is composed of ferromagnetic material/insulating barrier (not metal)/ferromagnetic material. If the barrier is very thin (usually <2 nm), electrons can tunnel through the barrier from one ferromagnetic material to another, or vice versa. More detailed information on these sensor types is readily available to those skilled in the art.

Figure 7A:
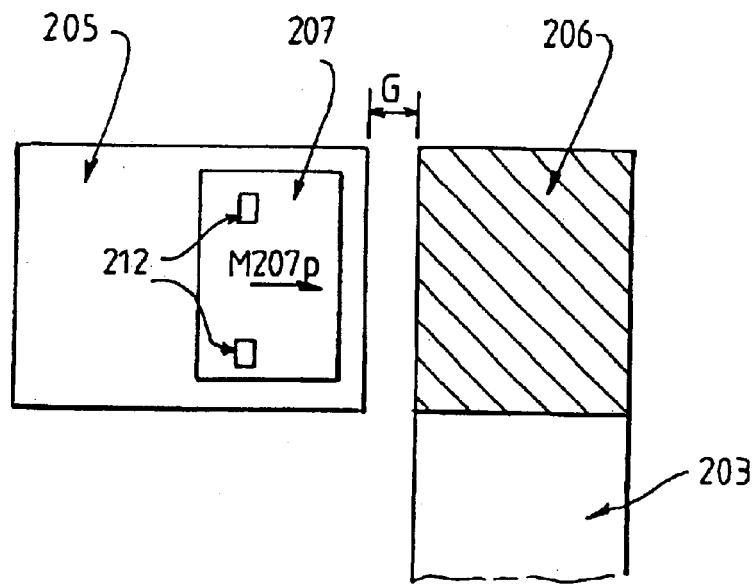
FIGS. 7a and 7b show respectively a plan and section view of a force sensing device according to the invention.
Figure 7B:
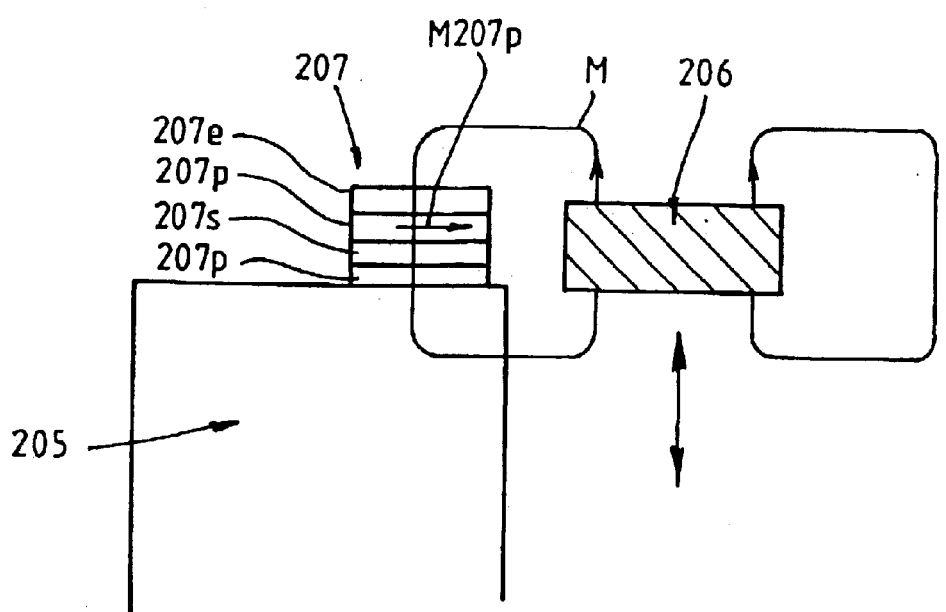

Referring to FIGS. 7a and 7b, the sensor 207 is mounted on the sensor support 205 such that the free layer 207f is adjacent the support 205, with the exchange layer 207e at the top of the stack. The direction of magnetisation of the pinned layer 207p is shown as $M_{207p}$. The stack (207e, 207p, 207s, 207f) is located close to the magnetic film 206 such that its magnetic field M influences the free layer 207f of the sensor 207. It can be seen that the direction of the magnetic field seen by the free layer 207f will vary with displacement of the magnetic film 206.

The effect of this displacement can be readily seen in FIGS. 8a, 8b, and 8c. As the film 206 is displaced upwards, the direction of magnetic field M becomes increasingly parallel and in the same direction as the direction of magnetisation $M_{207p}$ of the pinned layer 207p, as shown in FIG. 8a. This corresponds to the minimum resistance of the sensor 207. In FIG. 8b, the film 206 is shown at its rest position (y=0) and the direction of the magnetic field M of the film 206 is perpendicular to the magnetisation direction of the pinned layer $M_{207p}$. This corresponds to an intermediate level of resistance of the sensor 207. In FIG. 8c, the film 206 is shown with a downwards displacement, the direction of magnetic field M becomes increasingly parallel but in the opposite direction to the direction of magnetisation $M_{207p}$ of the pinned layer 207p. This corresponds to the maximum resistance of the sensor 207.

The device 201 with perpendicular magnetic film 206 may be implemented as a microphone, converting acoustic vibration into electrical signals. It may also be implemented as a filter as shown in FIG. 9. The filter 290 has a frequency response which includes a resonant frequency band, over which the device may be used as a filter. The resonant frequency band will depend on the mechanical design of the resonator 290.

The filter 290 uses a hard perpendicular magnetic film 297 on a central moveable member 295, to which is applied an input signal 242. When the frequency of the input signal is around the resonant frequency of device 295, vibration of the hard magnetic film 206 occurs. Next to the magnetic film 297 on fixed supports 291 and 292, are mounted a pair of CIP GMR sensors 293 on either side of the film 297. Other sensor types could alternatively be used. The output voltage across the electrodes 294 of each sensor will vary proportionally to the perpendicular or vertical displacement of the hard magnetic film 297.

To increase the signal-to-noise ratio of the output of the device 290, a differential signal detection method is implemented. Noise results from sources such as fluctuation to the voltage supply, and thermal noise. Because the two sensors 293x and 293y are arranged on opposite sides of the hard magnetic film 297, they will detect opposite directions of the magnetic field M. The directions of magnetisation of the pinned layers in each sensor are the same. This results in a positive output voltage for a positive displacement of the magnetic film 297 for one sensor 293x, and a negative output voltage for the same displacement using the other sensor 293y; and vice versa. By applying these outputs to a differential detector 299, the output is the combined output of the two sensors 293x and 293y. The noise from the device 290 is also reduced due to cancelling of noise common to both sensors 293x and 293y due to the differential combination of the sensor signals by differential amplifier 299. Thus the signal-to-noise ratio of the device 290 is greatly enhanced.

FIG. 10 shows a section view of a filter device 290' similar to that of FIG. 9, but in which TMR sensors 93 are used. Generally the resistivity ratio of these devices is higher than GMR devices.

Figure 11:
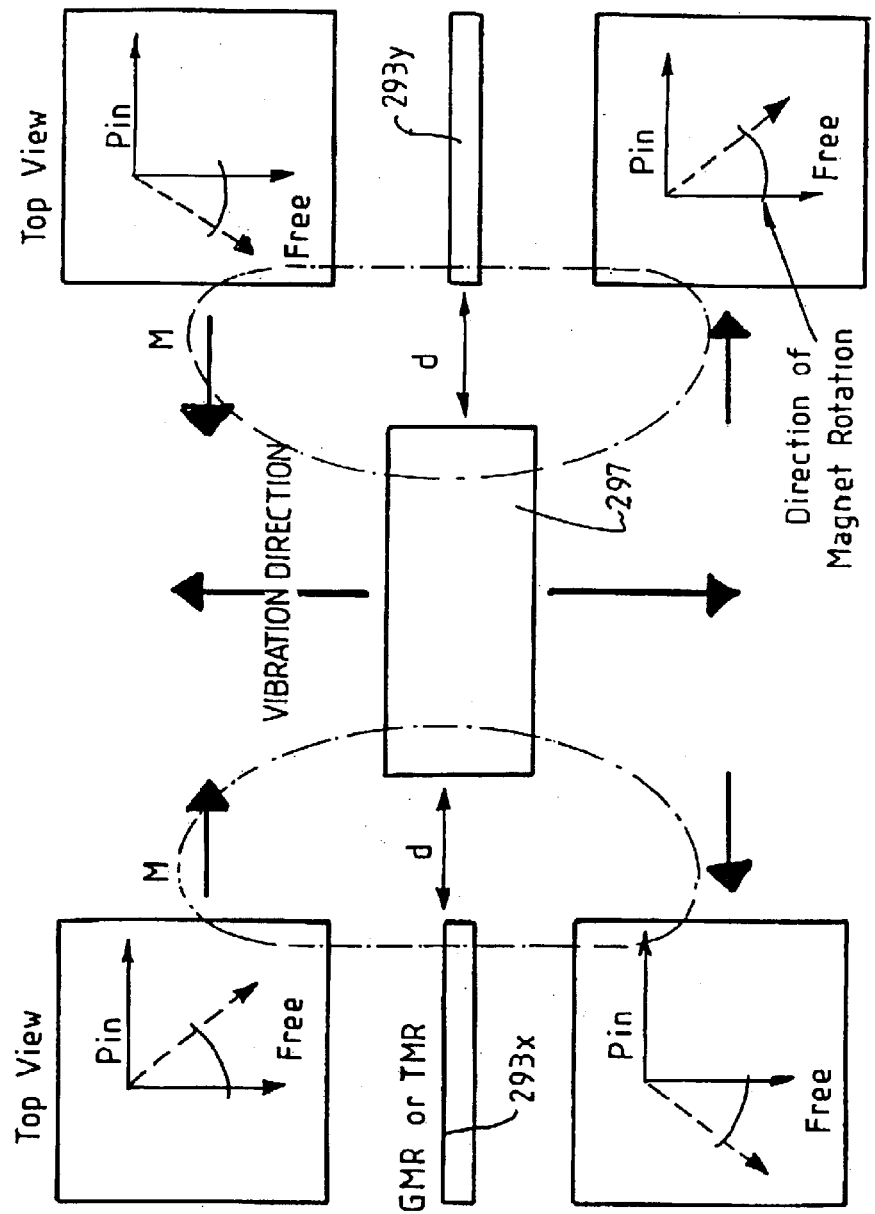

FIGS. 11 and 12 illustrate the differential detection methods principle of operation. The two sensors 293x and 293y have pinned layers 293p with the same direction of magnetisation. It can be seen that the magnetic field M of the magnetic thin film 297 is only perpendicular to the sensors 293 when the thin film 297 is not displaced vertically (y=0). As the thin film 297 is displaced vertically, it can be seen that the magnetic field M from the thin film 297 varies in different ways for the two sensors 293x and 293y. As the magnetic thin film 297 is displaced downwardly as shown in FIG. 11, the magnetic field M at both sensors angles inward towards the thin film 297. As the free layer of the sensor has a high permeability in the plane, it feels the horizontal component of the magnetic filed M from the hard magnetic film. However as the two sensors 293x and 293y are located on either side of the thin film 297, the horizontal components of the magnetic fields detected $M_{293x}$ and $M_{293y}$ respectively have opposite directions and therefore result in the sensors having different resistivities.

FIG. 13 shows a comparison between a device 290 using the differential detection method described above, and a device using a sensor 293 on only one side of the thin film 297. The output of the device using the differential detection method is greater, and also has a higher signal-to-noise ratio due to cancellation of common noise. Because of this a larger gap size can be used for a differential detector of the same sensitivity; this allows cheaper fabrication methods to be employed.

FIG. 14 shows a fabrication process for a CIP GMR sensor. Step a) shows the resonator base fabrication which utilises a deposition method such as sputtering and a subsequent etching method such as plasma etching. In step b), an insulating film is deposited to insulate the resonator base from the GMR sensor. Step c) is GMR film deposition and sensor pattern forming. The GMR stack is deposited by sputtering and a photoresist layer is coated and lithographically patterned. In step d), for a fine pattern for the GMR sensor, dry etching is executed. In step e), hard magnetic film is deposited and the photoresist is lifted off. Step f) makes the shape of the hard magnetic film in the plane, the redundant portion is etched by dry etching. In step g), to make electrodes for the GMR sensor, material for the electrodes (eg Ti, Cr, Al, Cu) is deposited and then etched after making the preferred pattern. In step h), in order to make two gaps between the resonator and sensors, photoresist is coated and a protective mask against etching is formed. In step i), dry etching is executed to remove the photoresist.

Figure 15:
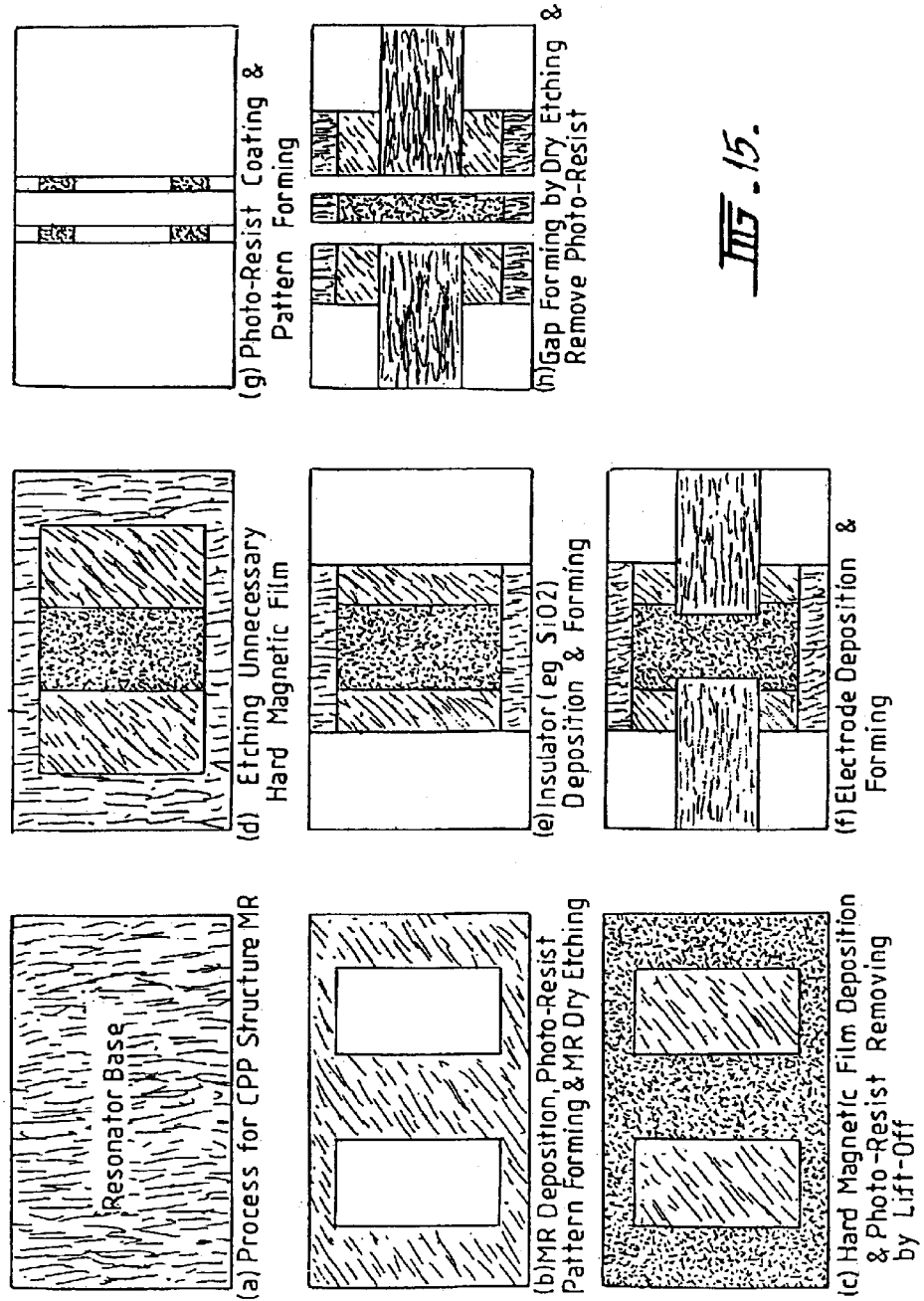

FIG. 15 shows a fabrication process for a CPP GMR sensor. Step a) shows the resonator base fabrication which utilises a deposition method such as sputtering and a subsequent etching method such as plasma etching. In step b), the TMR or GMR stack is deposited by sputtering and photoresist is coated and lithographically patterned. Dry etching is then executed. In step c), hard magnetic film is deposited and the photoresist lifted off. Step d) makes the shape of the hard magnetic film in the plane, the redundant portion being etched by dry etching. In step e), the insulation material such as SiO2 for isolating the electrodes of TMR or GMR from the resonator base is deposited. Then dry etching is executed after making the pattern by a photo-lithography process. In step f), the electrodes for the GMR sensor are made using for example Ti, Cr, Al, Cu material which is deposited and then etched after making the preferred pattern. In step g), the gaps between the resonator and sensors are made, photoresist is coated and a protective mask against etching is formed. Finally in step h), dry etching is executed and the photoresist removed.

FIGS. 16-1 and 16-2 show a fabrication process for a TMR sensor in which a) show the cross section of the resonator base. In step b), the insulator SiO2 is etched away to establish the bridge structure for the resonator. In step c) the hard magnetic film is deposited and photoresist is coated and lithographically patterned. Step d) shows the MR stack being added and step e) shows the lift-off process. In step f), a photoresist mask is formed and in step g) dry etching is executed to separate the hard magnetic film and sensors. In this process, hard magnetic film with Cr for the seed layer is deposited before GMR deposition. However it can be done vice versa, as also for FIGS. 13(c, d, e) and 14(b, c).

The invention has been described with reference to a preferred embodiment thereof. Alterations and modifications as would be obvious to those skilled in the art are intended to be incorporated within the scope hereof.

What is claimed is:

1. A force sensing device having a magnetised element and a magneto electric material being each relatively moveable with respect to the other in response to an applied force, the magnetised element having a magnetisation direction parallel to the direction of said relative movement;

the device being arranged such that said material is subject to the magnetic field of said element and such that an electrical property of said material which is indicative of said applied force varies dependent said relative movement.

2. A force sensing device as claimed in claim 1 wherein the magnetised element comprised a thin magnetic film having a magnetisation direction perpendicular to the plane of said film.

3. A force sensing device as claimed in claim 1 wherein the magnetic easy axis of the magneto electric material is perpendicular to said magnetisation direction.

4. A force sensing device as claimed in claim 1 wherein the magneto electric material is in the form of a sensor selected from one of the following types: CIP GMR; CPP GMR; TMR.

5. A force sensing device as claimed in claim 1 wherein two magneto electric materials are mounted in different location with respect to said element such that said relative movement causes different variations in the electrical property of each said material; and wherein the applied force is determined from the difference between the variations in said electrical properties.

6. A force sensing device as claimed in claim 1 wherein the material and the element are mounted on a substrate, the element being formed on a moveable member, the element and material being located adjacent each other at rest.

7. A force sensing device as claimed in claim 5, wherein the material and the element are mounted on a substrate, the element being formed on a moveable member, the element and material being located adjacent each other at rest and wherein the two said materials are mounted on opposite sides of said magnetised moveable member.

8. A force sensing device as claimed in claim 6 wherein the moveable member comprises a cantilevered member.

9. A frequency filter comprising a device according to claim 1, wherein the movable member has a resonant frequency.

10. A microphone comprising a device according to claim 1.

* * * * *